United States Patent [19]

Murdoch et al.

[11] Patent Number: 5,100,502
[45] Date of Patent: Mar. 31, 1992

[54] SEMICONDUCTOR WAFER TRANSFER IN PROCESSING SYSTEMS

[75] Inventors: Steven C. Murdoch, Palo Alto; Robert J. Steger, San Jose; Mahasukh Vora, Los Catos, all of Calif.

[73] Assignee: Applied Materials, Inc., Santa Clara, Calif.

[21] Appl. No.: 495,885

[22] Filed: Mar. 19, 1990

[51] Int. Cl.$^5$ .................... B44C 1/22; H01L 21/306
[52] U.S. Cl. .................... 156/643; 118/728; 118/50.1; 118/620; 156/345; 204/298.35; 414/744.1
[58] Field of Search .................. 156/345, 643, 646; 118/728, 50.1, 620; 427/38, 39; 204/298.15, 298.23, 298.25, 298.26, 298.35; 414/744.1, 744.2, 744.8

[56] References Cited

U.S. PATENT DOCUMENTS

| | | | |
|---|---|---|---|
| 4,151,034 | 4/1979 | Yamamoto et al. | 156/643 X |
| 4,487,678 | 12/1984 | Noguchi et al. | 204/298.35 |
| 4,526,670 | 7/1985 | Hajj | 204/298.35 |
| 4,715,921 | 12/1987 | Maher et al. | 204/298.35 X |

Primary Examiner—William A. Powell
Attorney, Agent, or Firm—Clifton Anderson

[57] ABSTRACT

An improved semiconductor wafer transfer method and system incorporates a combination of wafer retractor (14) and wafer lifters (16) built into each processing chamber with a modified transport arm (12) to achieve large enhancements in wafer exchange speeds. The transport arm (12) brings a new wafer into a processing chamber (18) where an already processed wafer waits for retrieval, having been lifted into the central portion of the chamber by lifters (16). In a simultaneous action, lifters (16) lower the processed wafer onto a lower platform of the transport arm (12) while the wafer retractor (14) removes the new wafer from an upper platform of the transport arm (12). Once the transport arm (12) removes the processed wafer from the chamber (18), the retractor (14) lowers the new wafer onto the wafer lifters (16) and processing begins. The transport arm (12) delivers the processed wafer to a wafer buffer (58), which accompanies the transport arm (12), and retrieves a new wafer to start the wafer loading process again with the next processing chamber (18). The method and system of the present invention provides a flexible and rapid solution for loading and unloading wafer processing chambers.

19 Claims, 7 Drawing Sheets

SEMICONDUCTOR WAFER TRANSFER IN PROCESSING SYSTEMS

BACKGROUND OF THE INVENTION

The present invention relates to integrated circuit manufacture and, more particularly, to the transfer and loading of semiconductor wafers into and out of processing chambers.

The fabrication of integrated circuit devices often involves a complex interplay of photolithography, etching, plasma deposition and chemical vapor deposition (CVD) processes. Technological development has yielded advances in all areas of semiconductor integrated circuit manufacturing and design. Reductions in circuit size allow increasing numbers of circuits to be placed upon an individual semiconductor wafer. Refined processes permit circuit layers to be deposited and etched within shorter times. These technological breakthroughs have dramatically increased the manufacturing throughput of circuit devices: more devices can be made in less time.

Increased throughput, however, places enormous demands upon the support infrastructure of integrated circuit processing systems. The quantity and speed of processing tend to magnify any delays which occur along the processing path. In particular, the transport system for moving semiconductor wafers into and out of processing chambers has become a bottleneck in the fabrication cycle. Present etching processes may last only 120 seconds. Newer processes take as little as 60 to 80 seconds per wafer. Since the transport process itself can require 100 to 120 seconds per wafer, manufacturing efficiency is lost as processing chambers sit idle waiting for reloading.

Newer fabrication systems cluster multiple processing chambers around a central airlock area where holders of to-be-processed wafers are brought into and out of the processor, only exacerbating the wafer transportation problem. A transport arm brings each wafer to its proper processing chamber and upon process completion retrieves the wafer back to its holder. When the transport system cannot keep up with the rapid processing of wafers in each of the clustered chambers, further backups occur and total output suffers.

What is needed is an improved method and system for carrying semiconductor wafers to and from processing chambers. The method and system should rapidly load and unload wafers from individual chambers, while maintaining precision and safety. In addition, the method and system should remain adaptable to a wide variety of processing environments and should readily handle multiple chambers without producing undesirable slowdowns and bottlenecks.

SUMMARY OF THE INVENTION

In accordance with the present invention, a semiconductor wafer transfer method and system conveys a new wafer into a semiconductor processing chamber while an already processed wafer still remains within the chamber, and then conveys the processed wafer out of the chamber while the new wafer remains inside. The ability of the present invention to perform the simultaneous operations of delivery and retrieval of wafers achieves remarkable increases in wafer throughput by eliminating wasteful trips from wafer holders to processing chambers. The conveyance means can incorporate a combination of wafer retractor and wafer lifters build into each processing chamber with a modified transport art to achieve the large enhancements in wafer exchange speeds. Preferably, the transport arm has the capcity to carry two semiconductor wafers at one time. In addition, the incorporation of a moving wafer buffer eliminates the need to move to the stationary wafer holder to retrieve each wafer. The method and system of the present invention provides a flexible and rapid solution for loading and unloading wafer processing chambers.

The preferred wafer transfer embodiment combines a double-bladed transport arm with a combination of retractor and set of lifting pins built into each processing chamber to increase wafer throughput. The wafer transport arm is initially loaded with a wafer to be processed. The transport arm can load itself from a stationary buffer of wafers, or from a buffer cassette which moves with the arm. The wafer to be processed rests upon an upper blade of the transport arm. The transport arm carries this wafer into a processing chamber. The upper portion of the processing chamber contains a wafer retractor and the lower portion contains a set of lifting pins. During steady production, the chamber will already contain a wafer that has just completed processing. The processed wafer rests upon the set of lifting pins. These pins lift the wafer into the middle of the chamber, before the transport arm enters the chamber, so that the processed wafer lies balanced between the upper and lower blades of the transport arm.

Once the arm has fully entered the chamber, the wafer retractor lowers to grasp the to-be-processed wafer from the upper blade to the transport arm, while the lifting pins lower the second already-processed wafer onto the arm's lower blade. As soon as the processed wafer is secured upon the lower blade, the transport arm removes the wafer from the chamber. After removal of the processed wafer, the lifting pins raise upwards again to meet the retractor, which lower the to-be-processed wafer onto the pins. While the pins lower the wafer to the chamber cathode in order to begin wafer processing, the transport arm carries the processed wafer back either to the stationary buffer or to the moveable buffer cassette in order to retrieve a new, unprocessed wafer. After processing has finished, the loading and retrieval procedure begins again.

Prior methods of loading and unloading semiconductor wafers required a complete round trip of the transport arm for each loading and each unloading of a wafer. The prior methods more than doubled the length of time required to service each wafer processing chamber, severely limiting the potential throughput of each processing system.

The present invention combines wafer loading and extraction into a single round-trip action: the transport arm enters the processing chamber only once to both load a new wafer and extract a processed one. In addition to increasing the speed of loading wafers into and out of processing chambers, the present invention increases throughput by including a dedicated moveable buffer of wafers. In a typical processing environment comprising several processing chambers clustered around the transport arm, the dedicated buffer would follow the transport arm from chamber to chamber, eliminating the need to continually retrieve wafers from a more distant stationary buffer. These and other features and advantages of the present invention are apparent in the description below with reference to the following drawings.

DESCRIPTION OF THE PREFERRED EMBODIMENTS

Figure 1:
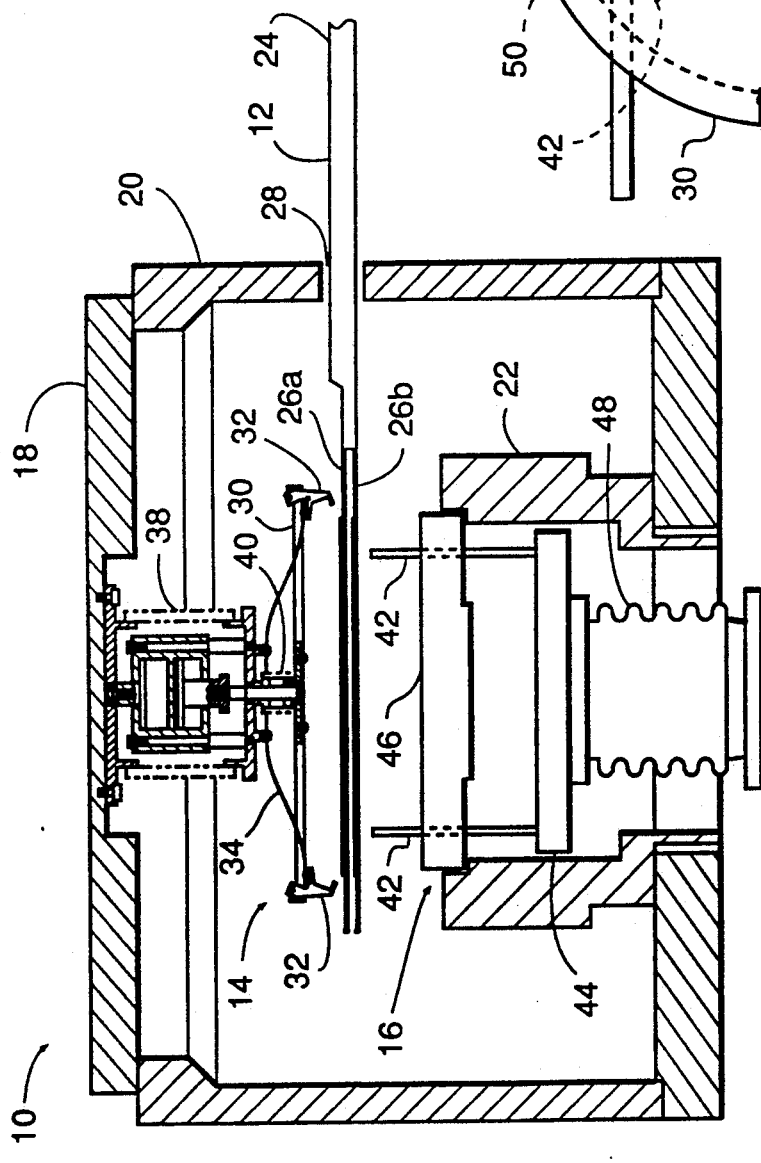
FIG. 1 is a cross-sectional view of a semiconductor wafer processing chamber and transport system in accordance with the present invention.

An improved semiconductor wafer transport system 10, as revealed in FIG. 1, comprises a wafer transporter 12, a wafer retractor 14 and a wafer support 16. The wafer retractor 14 is placed in the upper portion of a processing chamber 18, while the support 16 is located in the chamber's lower portion. An etch processing chamber 18 provides an electrical anode 20 in its upper portion and a cathode 22 in its lower portion to direct etchants along electrical field lines to anisotropically etch a semiconductor wafer. While the present invention is disclosed with reference to this particular environment, the invention is equally useful in CVD, plasma or other wafer processing systems.

The wafer transporter 12 comprises a wafer transport arm 24 and two platforms 26a and 26b, located at arm's end. The two platforms are close enough vertically to permit the transport arm 24 to enter the chamber opening 28 without touching its upper and lower sides. The wafer retractor 14 comprises a clip plate 30, wafer clips 32 located circumferentially around the clip plate 30, a flexible spring flexure 34 and a first and second bellows 36 and 38. The wafer support 16 comprises a set of lifting pins 42 held fixed relative to one another by a pin holder 44, and aligned by a cathode pedestal 46. The set of supporting pins are raised and lowered by the pin actuator 48.

Figure 2:
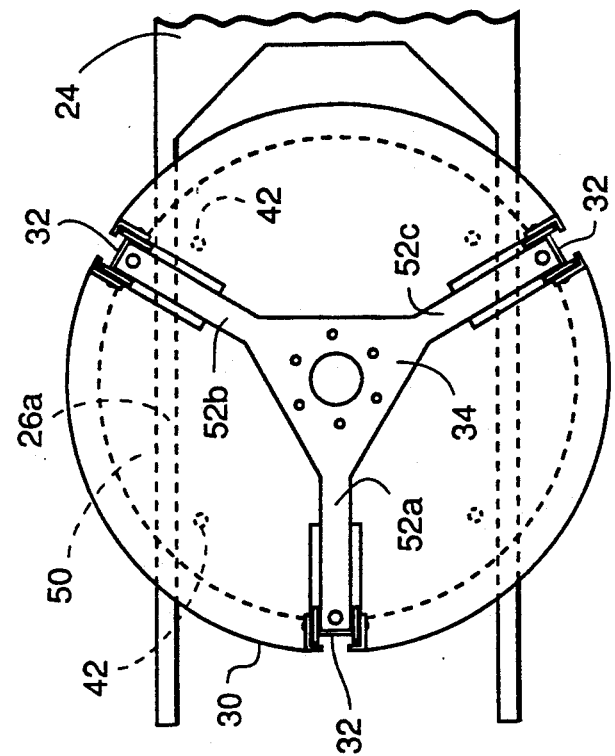
FIG. 2 is a top view of the wafer retractor and lifting pins of the embodiment illustrated in FIG. 1.

The relative placement of the supporting pins 42, wafer clips 32, wafer and platform can be seen in the topview diagram of FIG. 2. The circuit semiconductor wafer 50 rests upon the transport platform 26a, revealed in dashed hidden lines. The four supporting pins 42 are located equidistant from the wafer's center and around the edge of the transport platform 26a. The wafer retractor clip plate 30, an annular-shaped element extending around the wafer 50, supports the set of wafer clips 32 which can grasp and release the semiconductor wafer at its edges. The flexure spring 34 extends outward from the center of the wafer retractor 14 with three arms 52a,b,c which attach to each wafer clip 32.

Figure 3:
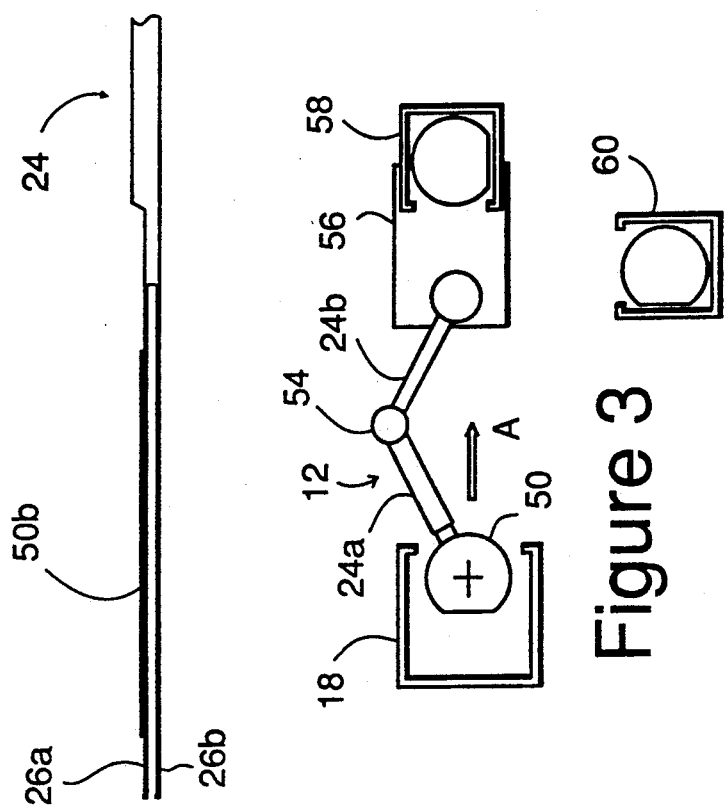
FIG. 3 is a schematic diagram of a semiconductor wafer processing and transport system incorporating a moveable wafer buffer cassette.

The incorporation of the improved semiconductor wafer transport apparatus within a processing environment is shown in FIG. 3. Wafer transporter 12 services the processing chamber 18, which may be only one of many within the airtight processing environment. The wafer transport arm 24 is actually composed of two parts, a forward arm 24a and a rear arm 24b which are linked together and actuated to bend around their hinged joint 54. This hinging action allows the wafer transporter 12 to move a wafer 50 into and out of chamber 18 in a straight line, indicated by arrow A. The rear arm 24b is anchored to a movable transport platform 56, which in the preferred embodiment also possesses at least one buffer cassette 58 for storing both processed and to-be-processed wafers. These wafers are eventually returned to a stationary buffer 60, which transports groups of wafers into and out of the processing system via an airlock.

Operation

Figure 4A:
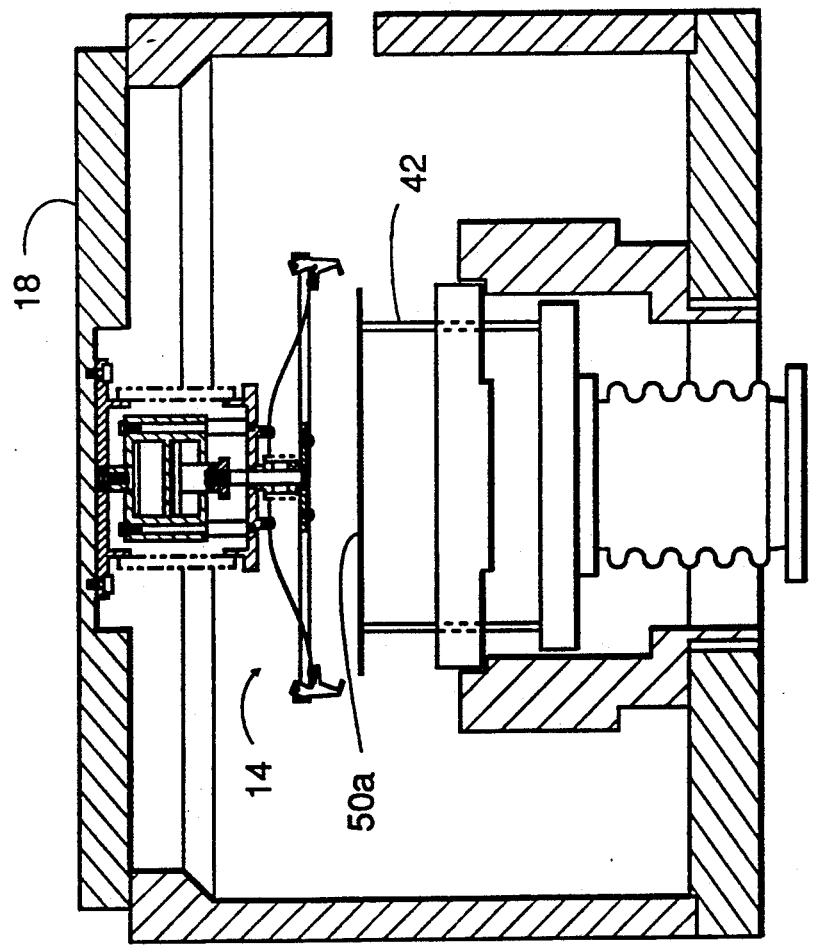
FIGS. 4a through 4d are cut-away illustrations of the apparatus of the present invention loading and retrieving wafers in a sample processing chamber.

The methods and apparatus of the present invention allow the loading of a fresh wafer into a semiconductor processing chamber while simultaneously removing an already-processed wafer from the chamber. In the processing chamber 18, as shown in FIG. 4a, a first semiconductor wafer 50a has just completed its processing run. Wafer transport arm 24 has a second wafer 50b loaded onto its upper platform 26a. The transport arm 24 preferably has loaded the second wafer 50b from the moveable buffer cassette 58 travelling near to the arm. Before the transport arm 24 enters the chamber with a fresh wafer 50b, the lifting pins 42 raise the processed wafer 50a upwards into the center of the chamber.

Figure 4B:
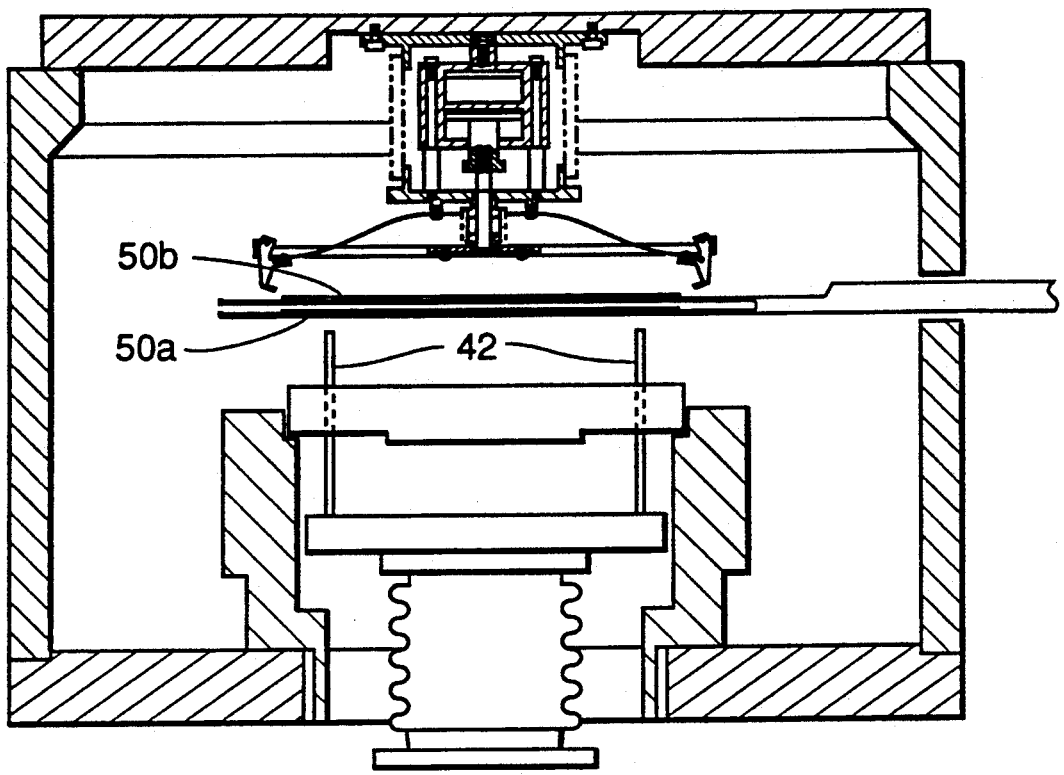
Figure 4C:
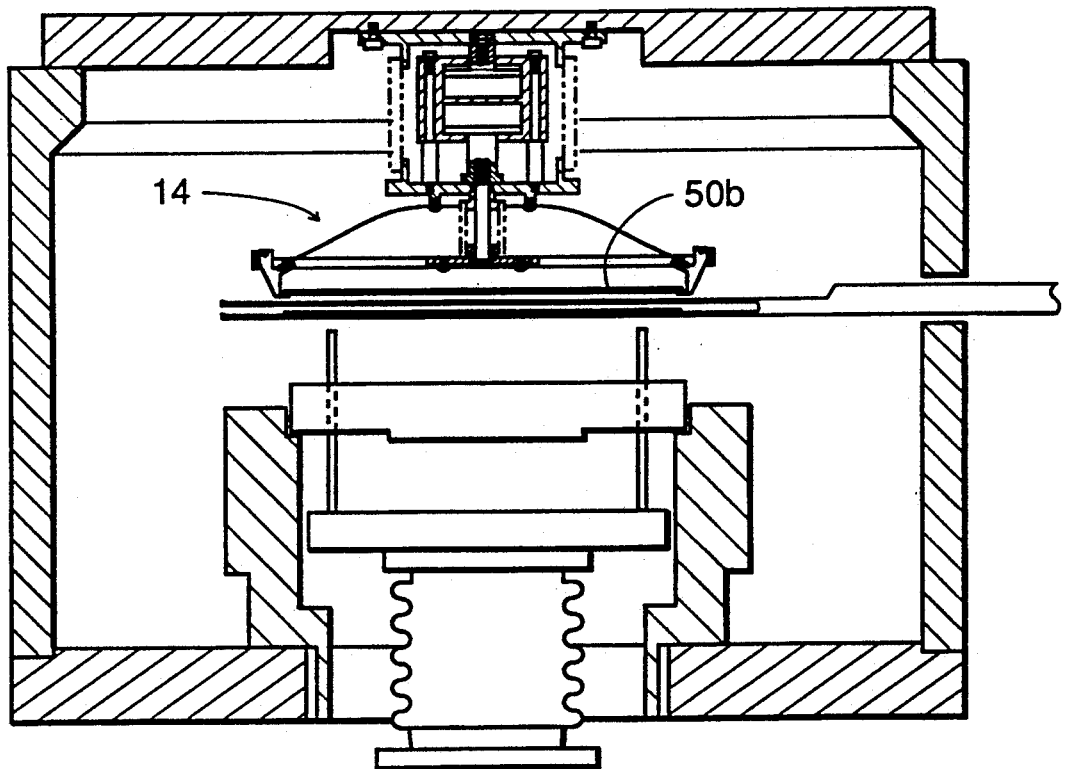
Figure 4D:
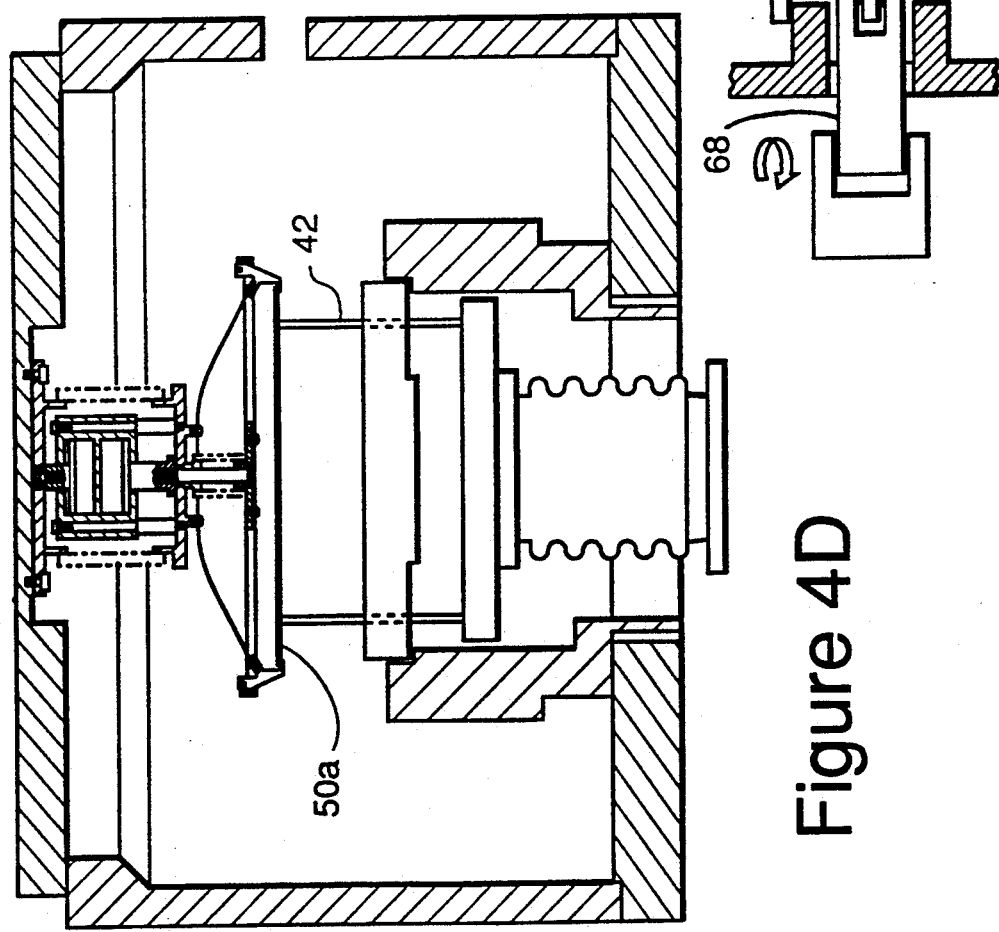

When the transport arm 24 has fully extended into the processing chamber, the first, processed wafer 50a lies within the upper and lower platforms 26a and 26b of the wafer transporter 12, supported by the lifting pins 42 as shown in FIG. 4b. As the retractor 14 moves downward and extends its clips 32 to pick up the fresh wafer 50b from the upper platform 26a, the lifting pins 42 descend, allowing the processed wafer 50a to rest upon the lower platform 26b of the transport arm 24. These actions are illustrated in FIG. 4c. The transport arm 24 exits the processing chamber 18 with the processed wafer 50a secure upon its lower platform 26b, as shown in FIG. 4d. Simultaneously, the lifting pins 42 once again rise upwards as the wafer retractor 14 descends with the fresh wafer 50b. Once the wafer is secure upon the lifting pins, the retractor releases the wafer and the lifting pins can fully descend to the position appropriate for wafer processing. As soon as wafer 50b finishes it process run, the load/unload cycle begins again.

The action of wafer retractor 14 and lifting pins 42 is illustrated in FIG. 5a through 5e. (For clarity, the transport arm 24, whose first and second platforms 26a and 26b support the two wafers 50a and 50b, is not shown). Processed wafer 50a rests below new wafer 50b, supported by lifting pins 42. The wafer retractor 14 is in its fully retracted, upper state. The retractor is comprised of a primary air cylindrical 62 and bellows 38, which controls gross vertical movement, and a secondary air cylinder 64 and bellows 40, which governs the fine vertical movement of the clip plate 30 and the actuation of the wafer clips 32. The first and second bellows 38 and 40 provide vacuum isolation between the outside atmosphere and the process chamber 18.

Figure 5A:
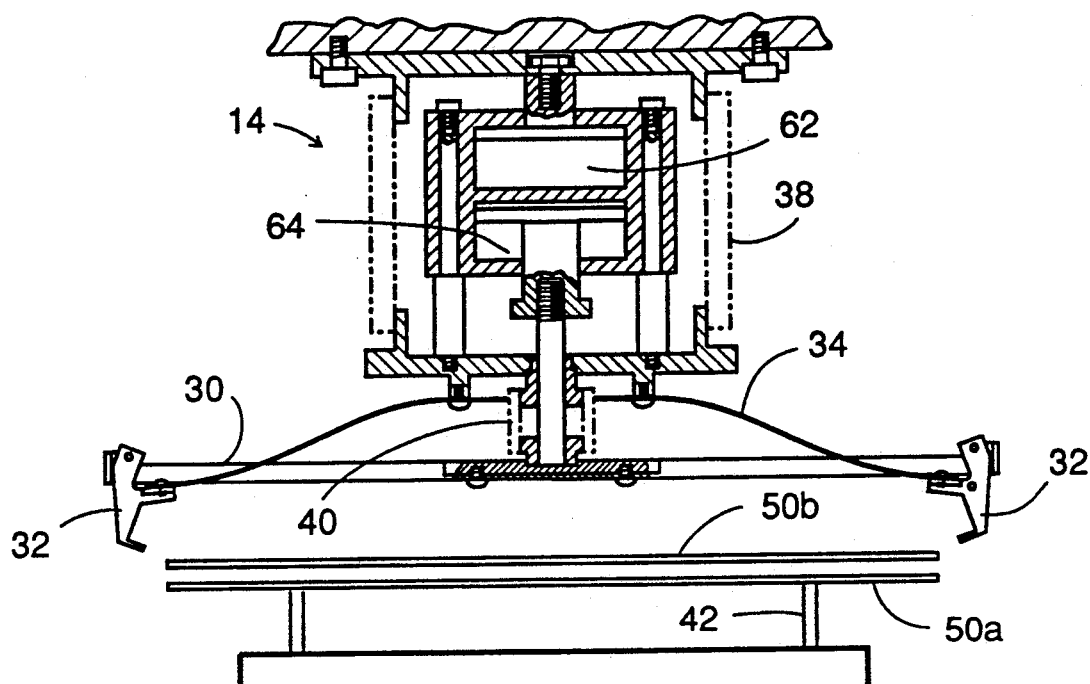
FIGS. 5a through 5e are cross-sectional views of the wafer retractor and lifting pins of the embodiment during the several stages of operation as shown in FIGS. 4a through 4d.
Figure 5B:
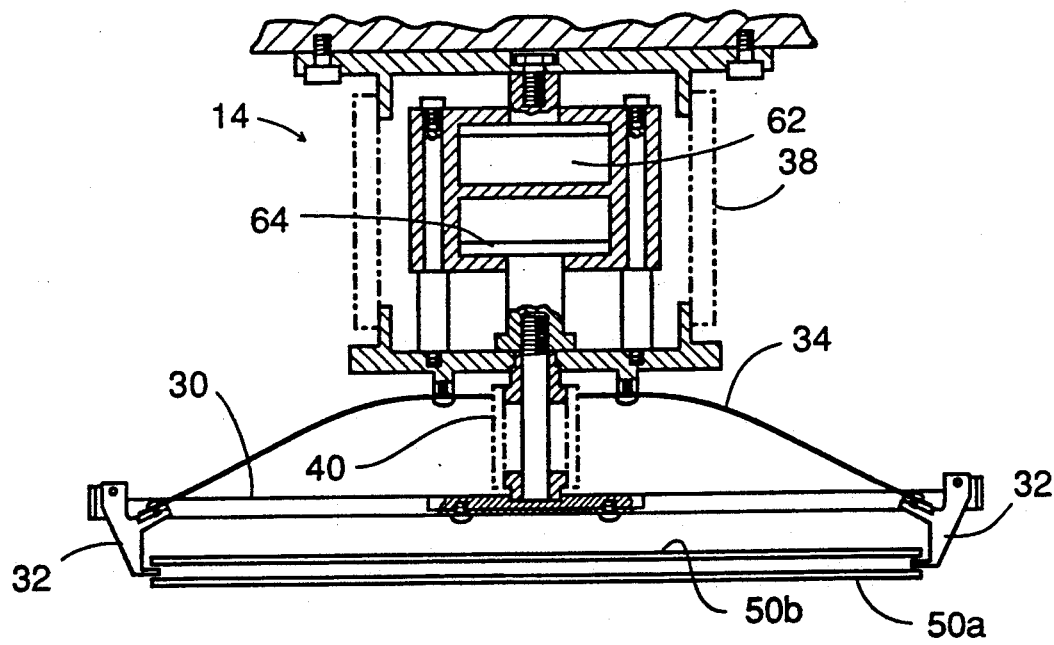
Figure 5C:
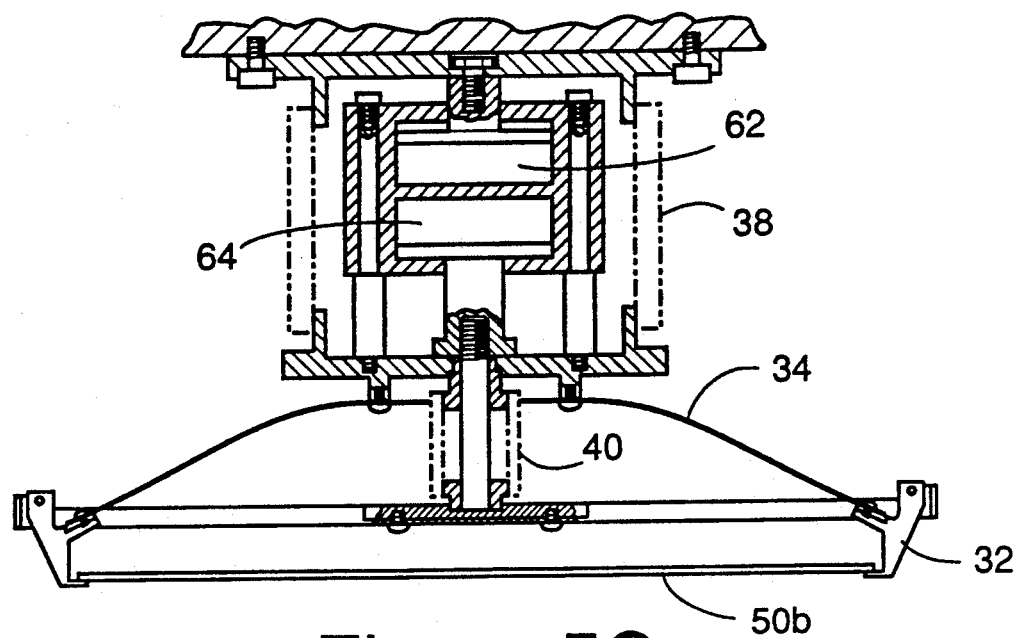

Once the new wafer has been positioned in the chamber, both the first and second actuators and bellows extend to reach and engage the new wafer 50b as revealed in FIG. 5b. The first air cylinder 62 extends the retractor apparatus downwards. The second air cylinder 64, while expanding the second bellows 40, performs two simultaneous actions. First, the slip plate 30 and clips 32 move closer to the surface of the new wafer 50b. Second, the flexure 34, being tensioned, pulls the clips 32 inward so that they grasp underneath the wafer 50b. Once the new wafer 50b is positioned above the clips 32, the first bellows 38 and air cylinder 62 retract as shown in FIG. 5c, lifting the new wafer 50b upwards, off of the first platform 26a of the transport arm 24. The arms 24 can then remove the processed wafer 50a from the chamber 18, as described above.

Figure 5D:
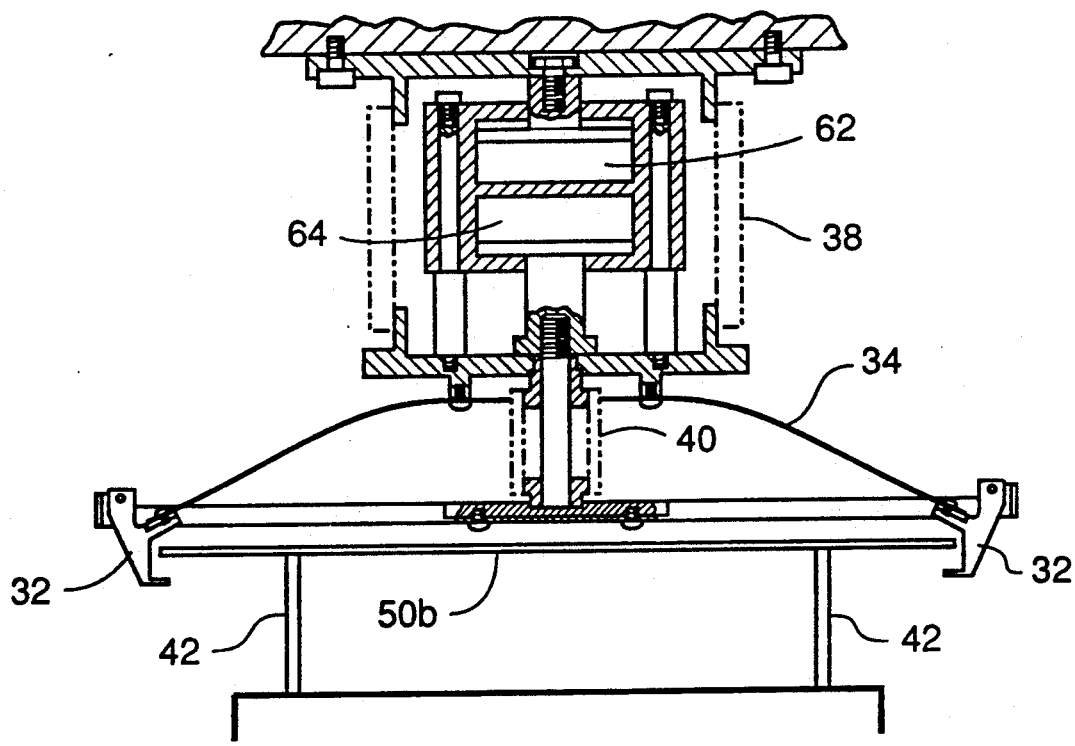
Figure 5E:
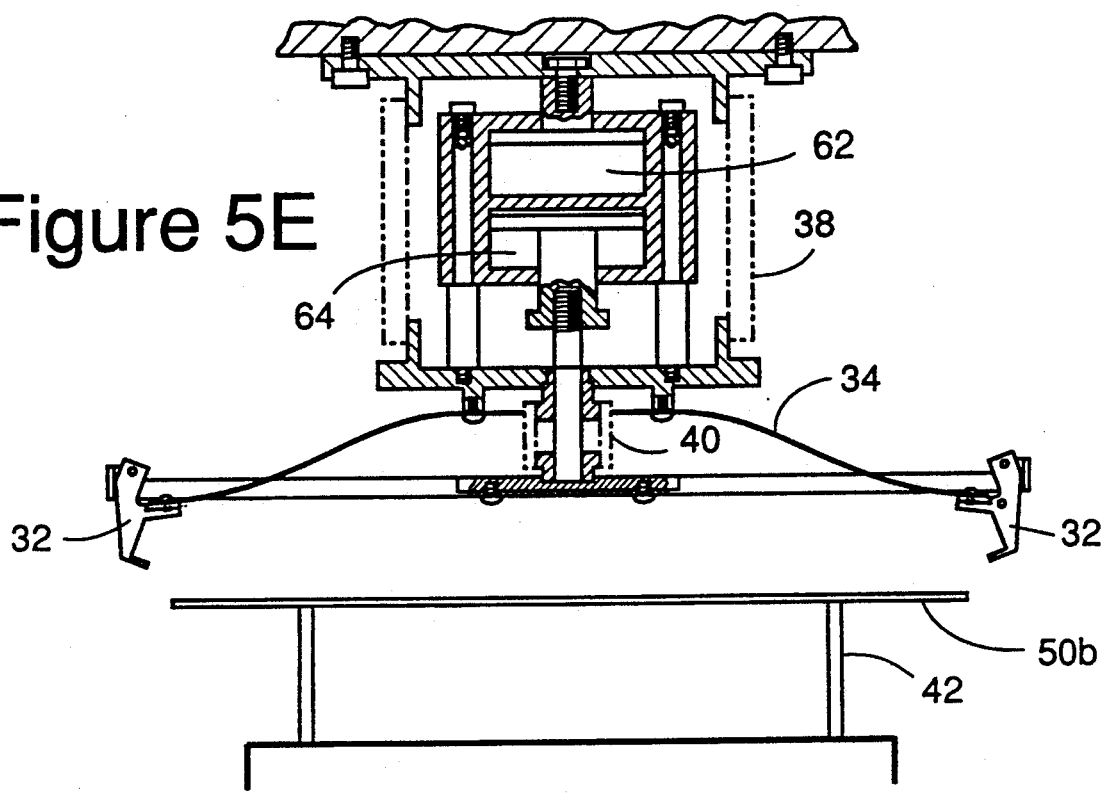

After removal of the already-processed wafer 50a, the lifting pins 42 rise to lift the new wafer 50b off of clips 32, as shown in FIG. 5d. The second bellows 40 and air cylinder 62 contract to release tension from the retractor flexure 34, allowing the clips 32 to gain clearance around the supported wafer 50b, as seen in FIG. 5e. The first bellows 38 and air cylinder 60 then retract to lift the clip plate 30 and clips 32 from the wafer 50b, so that the wafer 50b may lower to the proper processing position and processing can commence.

Figure 6:
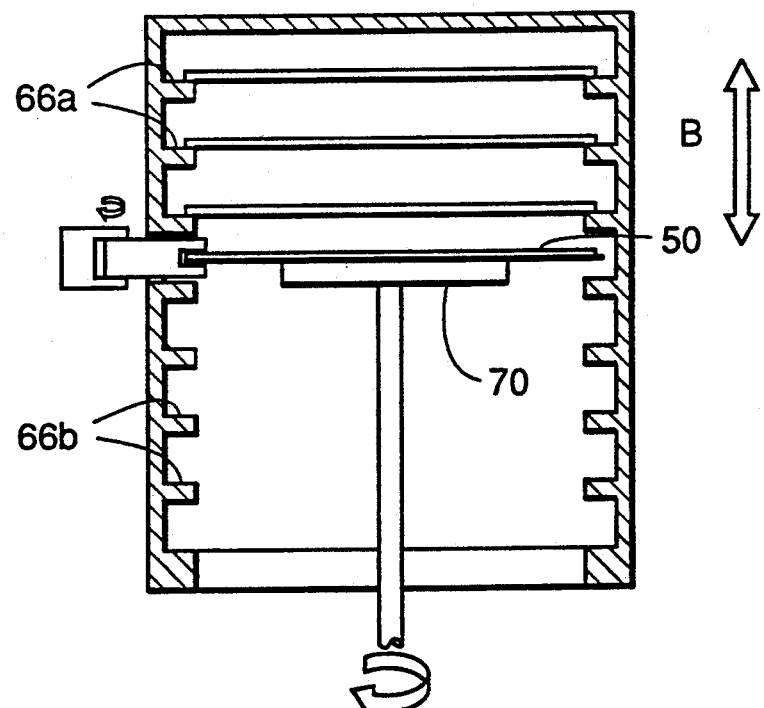
FIG. 6 is a cross-sectional view of a moveable wafer buffer possessing apparatus for aligning semiconductor wafers.

The addition of one or more moveable buffer cassettes 58 which are attached to the transport platform 56, enables a more efficient transfer of wafers by wafer transporter 12 to each processing chamber 18. A buffer cassette 58 can hold both the already processed wafers 50a and the new, to-be-processed wafers 50b. In the preferred embodiment, the moveable buffer can store twice as many wafers as there are process modules. The cross-sectional drawing of a buffer cassette 58, shown in FIG. 6, has slots for eight wafers and services a processing system containing four processing chambers 18. The buffer cassette reserves the top four slots 66a for new, to-be-processed wafers 50b and keeps the bottom four slots 66b for already processed wafers 50a, those wafers that will be taken back to the stationary buffer 60 after all processing chambers are serviced.

Figure 7:
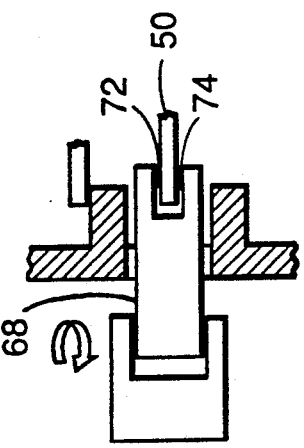
FIG. 7 is a detail drawing of the alignment sensor incorporated into the moveable wafer buffer shown in FIG. 6.

The buffer cassette 58 indexes up and down as indicated by arrow B to keep the particular slot 66a or 66b in the operational plane of the transport arm 24. The buffer cassette also contains an wafer orientation sensor 68 and rotating pedestal 70 to place wafers into the buffer slots 66 with the same orientation. Semiconductor wafers conventionally have one flat end to orient all the integrated circuits on their surface. Keeping all wafers at the same orientation facilitates further processing. As wafers are loaded into the buffer cassette 58, they are first placed upon the rotating pedestal 70 and the orientation sensor 68 swings into place around the rotating wafer 50. The orientation sensor 68 possesses a light source 72, preferably a light emitting diode, and a light sensor 74, revealed in FIG. 7. When the flat portion of the wafer's disc passes by the light source 72 and sensor 74, the resulting signal can be used to stop the rotation of the pedestal 70, leaving the semiconductor wafer in its proper, precise orientation. After the pedestal 70 lowers the wafer 50 onto its respective slot, and the orientation detector 68 swings out of the way, the buffer cassette indexes upwards to allow another wafer to be inserted and oriented in the next slot. The operation of the buffer cassette, with its orientation mechanisms, in parallel with the transfer operations of the wafer transport system ensure that all wafers maintain their proper orientation during all processing steps.

Figure 8:
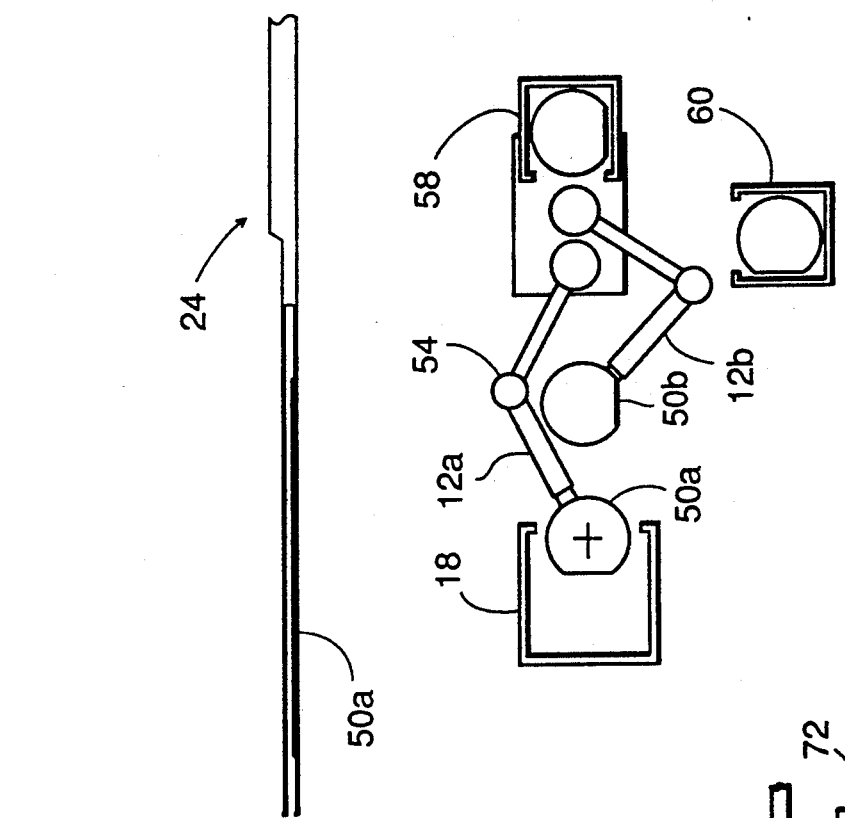
FIG. 8 is an alternative embodiment of the present invention incorporating two separately controllable arms.

Instead of a single wafer transport arm possessing two platforms, several alternative embodiments of the present invention are possible. For example, two separately controlled arms 12a and 12b may be employed, as seen in FIG. 8, to separately load and unload the processing chamber 18. Each arm would perform only one task, for example 12a would only retrieve processed wafers 50a and arm 12b would only load new wafers 50b. Depending upon the actual geometry of a particular processing chamber 18 and the clearance available for its entrance, transport arms 12a and 12b could be designed thin enough and close enough to simultaneously enter the processing chamber, or at least follow one another in close succession. The same system of wafer retractor 14 and wafer support 16 would remain within the processing chamber to facilitate the smooth loading and unloading of the wafers.

In another embodiment, only one arm 24 is used but it only has one platform 26. Again, the wafer retractor 14 and wafer support 16 would function in an identical manner as described above for the preferred embodiment. The only difference in operation, compared with the two-platform arm, would be the necessity of the arm 24 to exit the chamber 18 after delivering a new wafer 50b, such that the processed wafer 50a would be raised into the position where the one-platform arm 24 can re-enter the chamber underneath the wafer 50a in order to extract it.

The wafer transport method and apparatus of the present invention provides great improvements over conventional approaches in loading and unloading semiconductor wafers into and out of processing chambers. The inexpensive and unique approach of the present invention increases production throughput by linking the steps of loading new wafers and unloading processed wafers in a simultaneous or near-simultaneous manner. The addition of dedicated, moveable buffer provides further savings in transport time, while incorporating unique mechanisms for maintaining wafer orientation. Although the invention has been described in detail with reference to a particular preferred embodiment, those skilled in the art should recognize that various modifications and enhancements may be made without departing from the spirit and scope of the claims that follow.

What is claimed is:

1. An apparatus for positioning substrates for processing, said apparatus comprising:
   a chamber for isolating a first substrate from ambient conditions during processing reactions, and
   conveyance means for conveying a second substrate into said chamber while said first substrate is in said chamber while conveying said first substrate out of said chamber while said second substrate is in said chamber.

2. An apparatus as recited in claim 1 wherein said conveyance means further comprises:
   transport means for transporting said second substrate into said chamber and for transporting said first substrate out of said chamber; and
   removal means for removing said second substrate from said substrate transport means, said removal means located within said chamber.

3. An apparatus as recited in claim 2 further comprising:

support means for supporting said first substrate, said support means located within said chamber, said support means capable of delivering said first substrate to said transport means, and said support means capable of receiving said second substrate from said removal means.

4. An apparatus as recited in claim 2 wherein said transport means further comprises:
first platform means for supporting a substrate; and
arm means for supporting and moving said first platform means.

5. An apparatus as recited in claim 4 wherein said transport means further comprises:
second platform means for supporting a substrate, said second platform means supported by said arm means.

6. An apparatus as recited in claim 2 wherein said transport means further comprises:
first platform means for supporting a substrate;
first arm means for supporting and moving said first platform means;
second platform means for supporting a substrate; and
second arm means for supporting and moving said second platform means.

7. An apparatus as recited in claim 2 further comprising:
a buffer means for holding a plurality of substrates, said buffer means capable of receiving substrates from said substrate conveyance means and said buffer capable of delivering substrates to said substrate conveyance means.

8. An apparatus for positioning semiconductor wafers for processing, said apparatus comprising:
a chamber for isolating a first wafer from ambient conditions during processing reactions; and
a conveyor for conveying a second unprocessed wafer into said chamber while said first processed wafer is in said chamber and of conveying said first processed wafer out of said chamber while said second unprocessed wafer is in said chamber.

9. An apparatus as recited in claim 8 wherein said conveyor further comprises:
a wafer transporter capable of transporting said second wafer into said chamber and of transporting said first wafer out of said chamber; and
a wafer remover located within said processing chamber, said remover capable of removing said second wafer from said wafer conveyor.

10. An apparatus as recited in claim 9 wherein said conveyor further comprises:
a wafer support located within said processing chamber, said wafer support capable of delivering said first wafer to said wafer transporter and said wafer support capable of receiving said second wafer from said wafer remover.

11. An apparatus as recited in claim 9 wherein said wafer transporter further comprises:
a platform capable of supporting a wafer;
a moveable arm attached to said platform.

12. An apparatus as recited in claim 11 wherein said wafer conveyor further comprises:
a second platform capable of supporting a wafer, said second platform supported by said moveable arm.

13. An apparatus as recited in claim 9 wherein said wafer conveyor further comprises:
a first platform capable of supporting a wafer;
a first moveable arm attached to said first platform;
a second platform capable of supporting a wafer;
a second moveable arm attached to said second platform.

14. An apparatus as recited in claim 9 further comprising:
a buffer, said buffer capable of receiving wafers from said wafer conveyor and said buffer capable of delivering wafers to said wafer conveyor.

15. An apparatus as recited in claim 10 wherein said wafer transporter comprises a wafer retractor, said wafer retractor located in the upper portion of said chamber.

16. An apparatus as recited in claim 10 wherein said wafer support comprises a plurality of lifting pins, said lifting pins located in the lower portion of said chamber.

17. A method for transferring substrates to and from a processing chamber, said chamber isolating a first substrate from ambient conditions, comprising the steps of:
a) loading a substrate transporter with a second substrate;
b) moving a substrate transporter into said processing chamber; and
c) removing said second substrate from said substrate transporter within said processing chamber.

18. A method as recited in claim 17 further comprising the steps of:
d) placing said first substrate onto said substrate transporter within said processing chamber; and
e) removing said substrate transporter bearing said first substrate thereon from said processing chamber.

19. A method for transferring wafers to and from a processing chamber, said chamber isolating a first wafer from ambient conditions, comprising the steps of:
a) loading a first platform of a wafer transporter with a second wafer;
b) positioning said first wafer within said processing chamber;
c) moving said wafer transporter into said processing chamber, such that a second platform of said wafer transporter is adjacent to said positioned first wafer;
d) removing said second wafer from said first platform of said wafer transporter;
e) setting said first wafer onto said second platform of said wafer transporter; and
f) removing said wafer transporter with said first wafer from said processing chamber.

* * * * *